(12) United States Patent
Xiong

(10) Patent No.: US 9,971,220 B2
(45) Date of Patent: May 15, 2018

(54) COA SUBSTRATE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Yuan Xiong, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 88 days.

(21) Appl. No.: 14/405,888

(22) PCT Filed: Oct. 17, 2014

(86) PCT No.: PCT/CN2014/088801
§ 371 (c)(1),
(2) Date: Dec. 5, 2014

(87) PCT Pub. No.: WO2016/058172
PCT Pub. Date: Apr. 21, 2016

(65) Prior Publication Data
US 2016/0266425 A1    Sep. 15, 2016

(30) Foreign Application Priority Data

Oct. 15, 2014    (CN) .......................... 2014 1 0542924

(51) Int. Cl.
*G02F 1/1362*    (2006.01)
*G02F 1/1368*    (2006.01)
(Continued)

(52) U.S. Cl.
CPC .......... *G02F 1/1368* (2013.01); *G02F 1/1362* (2013.01); *G02F 1/136227* (2013.01);
(Continued)

(58) Field of Classification Search
CPC ..... G02F 1/1368; G02F 1/1362; H01L 29/66; H01L 27/12
(Continued)

(56) References Cited

U.S. PATENT DOCUMENTS

2004/0109110 A1    6/2004  Kim et al.
2004/0196423 A1    10/2004  Kuo et al.
(Continued)

FOREIGN PATENT DOCUMENTS

| CN | 1542520 A | 11/2004 |
|---|---|---|
| CN | 102768432 A | 11/2012 |

*Primary Examiner* — Sheng Zhu
(74) *Attorney, Agent, or Firm* — Ladas & Parry LLP

(57) ABSTRACT

A COA (Color filter On Array) substrate and a manufacturing method using the same are disclosed. The method includes: forming a first metal layer, a gate insulation layer, a color resist layer, an active layer, a second metal layer, a passivation layer, a via hole, and a transparent conductive layer in order. The via hole is used for connecting to the transparent conductive layer with the second metal layer. The transparent conductive layer is formed on the passivation layer. A gate electrode is formed by patterning the first metal layer. A drain electrode and a source electrode are formed by patterning the second metal layer. In the present invention, the color resist layer is made before the second metal layer.

10 Claims, 3 Drawing Sheets

(51) Int. Cl.
 *H01L 27/12* (2006.01)
 *H01L 29/66* (2006.01)
(52) U.S. Cl.
 CPC ........ *H01L 27/124* (2013.01); *H01L 27/1248* (2013.01); *H01L 27/1288* (2013.01); *H01L 29/66765* (2013.01); *G02F 2001/136222* (2013.01)
(58) Field of Classification Search
 USPC .............................. 257/72, 43; 438/29, 104
 See application file for complete search history.

(56) References Cited

U.S. PATENT DOCUMENTS

| | | | |
|---|---|---|---|
| 2004/0239838 A1 | 12/2004 | Lai | |
| 2007/0046185 A1* | 3/2007 | Kim | 313/504 |
| 2009/0236604 A1* | 9/2009 | Bae et al. | 257/72 |
| 2014/0021494 A1 | 1/2014 | Zhao | |
| 2014/0326990 A1* | 11/2014 | Wang et al. | 257/43 |

\* cited by examiner

COA SUBSTRATE AND MANUFACTURING METHOD THEREOF

BACKGROUND OF THE INVENTION

Field of Invention

The present invention relates to a field of liquid crystal displays, and in particular to a COA (Color filter On Array) substrate and a manufacturing method thereof.

Description of Prior Art

COA substrates have become a main research direction in the field of liquid crystal displays in order to solve issues regarding high alignment and increase the aperture ratio by manufacturing a color filter film on an array substrate. Conventionally, in a COA substrate, thin film field effect transistors, a color resist layer, and pixel electrodes are disposed sequentially on a substrate. A passivation layer is required to be disposed between drain electrodes of the thin film field effect transistors and the color resist layer, thus the manufacturing process becomes complicated, and the manufacturing cost increases. In the meantime, intervals between scan lines and data lines of the conventional COA substrate are narrow, a problem that capacitive coupling effects occur in the intersection areas of the data lines and the scan lines. Accordingly, it is necessary to eliminate the capacitive coupling effect by compressing widths of the data lines and scan lines in the intersection areas.

Therefore, a COA substrate and manufacturing method thereof are needed to solve the problems in the prior art.

SUMMARY OF THE INVENTION

An objective of the present invention is to provide a COA substrate and manufacturing method using the same, which is able to solve a technical problem of prior art, the technical problem is about increased cost of manufacturing another passivation layer.

To achieve the above objective, the present invention provides a COA substrate manufacturing method, comprises:

Providing a base substrate;

Forming a first metal layer on the base substrate, and patterning the first metal layer to form a gate electrode.

Forming a gate insulation layer on the gate electrode and on the base substrate which is not covered by the gate electrode.

Forming a color resist layer on the whole gate insulation layer, and etching the color resist layer at a position corresponding to the positions of the gate electrode to expose the gate insulation layer at a position corresponding to the gate electrode.

Forming an active layer on the color resist layer.

Forming a second metal layer on the active layer and on the color resist layer which is not covered by the active layer, and patterning the second metal layer by a mask to form a drain electrode, a source electrode, and a first common electrode.

Forming a passivation layer on the second metal layer.

Forming a via hole in the passivation layer for connecting to the second metal layer.

Forming a transparent conductive layer on the passivation layer.

In the COA substrate manufacturing method of the present invention, the step of forming an active layer on the color resist layer further comprises:

Forming the active layer on the exposed gate insulation layer.

In the COA substrate manufacturing method of the present invention, the mask has a first pattern, the transparent conductive layer has a plurality of domains, a shape of the first pattern is consistent with a setting area, the setting area is an area formed of obscurus strips on a boundary between the domains on the transparent conductive layer, and a projection of the setting area on the second metal layer corresponds to an area of the first common electrode.

In the COA substrate manufacturing method of the present invention, the method further comprises:

Patterning the first metal layer to form a second common electrode.

In the COA substrate manufacturing method of the present invention, the first common electrode and the second common electrode are connected to an identical common line.

In the COA substrate manufacturing method of the present invention, the transparent conductive layer comprises a pixel electrode, and storage capacitance is formed between the pixel electrode and the first common electrode.

To achieve the above objective, the present invention provides another COA substrate manufacturing method, comprises:

Providing a base substrate; forming a first metal layer on the base substrate, and patterning the first metal layer to form a gate electrode.

Forming a gate insulation layer on the gate electrode and on the base substrate which is not covered by the gate electrode; forming a color resist layer on the gate insulation layer.

Forming an active layer on the color resist layer.

Forming a second metal layer on the active layer and on the color resist layer which is not covered by the active layer, and patterning the second metal layer to form a drain electrode and a source electrode.

Forming a passivation layer on the second metal layer.

Forming a via hole in the passivation layer for connecting to the second metal layer.

Forming a transparent conductive layer on the passivation layer.

In the COA substrate manufacturing method of the present invention, the step of forming a color resist layer on the gate insulation layer further comprises:

Forming a color resist layer on the whole gate insulation layer; etching the color resist layer at a position corresponding to the gate electrode to expose the gate insulation layer corresponding to the gate electrode.

In the COA substrate manufacturing method of the present invention, the step of forming an active layer on the color resist layer further comprises:

Forming the active layer on the exposed gate insulation layer.

In the COA substrate manufacturing method of the present invention, the second metal layer is patterned by a mask to form a first common electrode on the second metal layer.

In the COA substrate manufacturing method of the present invention, the mask has a first pattern, the transparent conductive layer has a plurality of domains, a shape of the first pattern is consistent with a setting area, the setting area is an area formed of obscurus strips on a boundary between the domains on the transparent conductive layer, and a projection of the setting area on the second metal layer corresponds to an area of the first common electrode.

In the COA substrate manufacturing method of the present invention, the method further comprises:

Patterning the first metal layer to form a second common electrode.

In the COA substrate manufacturing method of the present invention, the first common electrode and the second common electrode are connected to an identical common line.

In the COA substrate manufacturing method of the present invention, the transparent conductive layer comprises a pixel electrode, and storage capacitance is formed between the pixel electrode and the first common electrode.

To achieve the above objective, the present invention provides a COA substrate, comprises:

A base substrate.

A first metal layer disposed on the base substrate, the first metal layer comprises a gate electrode of a thin film field effect transistor.

A gate insulation layer, a part of the gate insulation layer being disposed on the first metal layer.

A color resist layer disposed on the gate insulation layer, the gate insulation layer used to separate the first metal layer and the color resist layer.

An active layer, a part of the active layer being disposed on the color resist layer to form grooves.

A second metal layer disposed on the active layer, the second metal layer comprises a drain electrode and a source electrode of the thin film field effect transistor.

A passivation layer disposed on the second metal layer to form a via hole for connecting to the second metal layer.

A transparent conductive layer disposed on the passivation layer.

In the COA substrate manufacturing method of the present invention, the gate insulation layer comprises a first area. The color resist layer is disposed on an area excluding the first area in the gate insulation layer. The active layer is disposed on the first area, and the first area of the gate insulation layer corresponds to an area of the gate electrode.

In the COA substrate and manufacturing method of using the same, by manufacturing the color resist layer before the second metal layer is finished, manufacturing costs are reduced by saving one passivation layer.

DETAILED DESCRIPTION OF THE PREFERRED EMBODIMENTS

Figure 1:
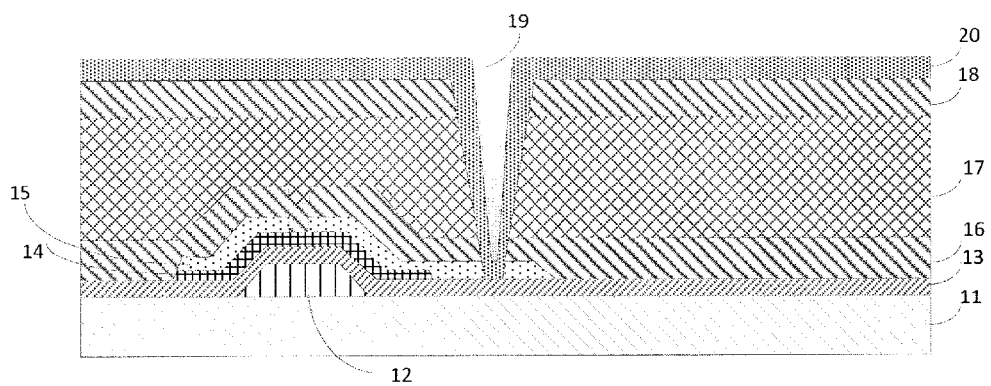
FIG. 1 is a schematic structural diagram of a COA substrate of the prior art.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, those units with similar structures are marked with the same labels.

FIG. 1 is a schematic structural diagram of a COA substrate of the prior art. In the prior art, the COA substrate comprises a base substrate 11, a first metal layer 12, a gate insulation layer 13, an active layer 14, a second metal layer 15, a first passivation layer 16, a color resist layer 17, a second passivation layer 18, and a transparent conductive layer 20.

The first metal layer 12 is disposed on the base substrate 11. The first metal layer 12 comprises a gate area of a thin film field effect transistor. The gate electrode is formed by patterning the first metal layer. Apart from the gate electrode, the first metal layer 12 is etched during the manufacturing process. A part of the gate insulation layer 13 is disposed on the first metal layer 12 which is used to insulate a drain electrode and a source electrode of the thin film field effect transistor.

A part of the active layer 14 is disposed on the gate insulation layer 13, which is used to form grooves between the drain electrode and the source electrode of the thin film field effect transistor.

The second metal layer 15 is disposed on the active layer 14. The second metal layer 15 comprises a drain area and a source area of the thin film field effect transistor. The drain electrode and the source electrode are formed by patterning the second metal layer 15. Apart from the drain electrode and the source electrode, the second metal layer 15 is etched during the manufacturing process.

The first passivation layer 16 is disposed on the second metal layer 15. The first passivation layer 16 is used to insulate the drain electrode and the color resist layer 17, and to insulate the source electrode and the color resist layer 17. The color resist layer 17 is disposed on the first passivation layer 16 and is used to form a color resist. The second passivation layer 18 is disposed on the color resist layer 17; the second passivation layer 18 is used to insulate the color resist layer 17 and the transparent conductive layer 20. The transparent conductive layer 20 is disposed on the second passivation layer 18. The transparent conductive layer 20 comprises a pixel electrode, which are connected with the drain electrode through the via hole 19.

Figure 2:
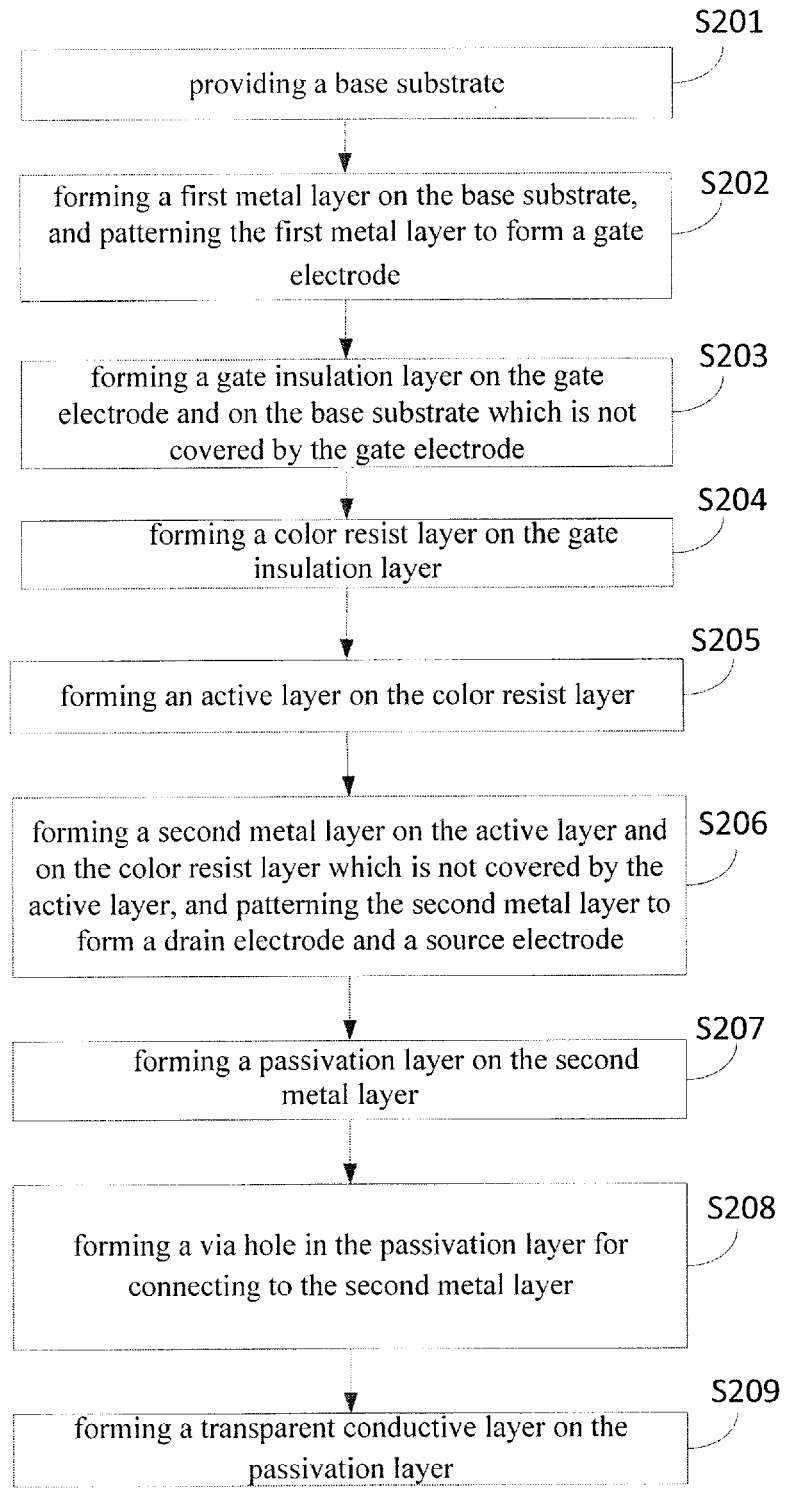
FIG. 2 is a flow-chart diagram of a COA substrate manufacturing method of the present invention.

Refer to FIG. 2, which is a flow-chart diagram of a COA substrate manufacturing method of the present invention. The method comprises:

S201, providing a base substrate;

S202, forming a first metal layer on the base substrate, and patterning the first metal layer to form a gate electrode;

Particularly, in S202, the first metal layer is exposed, developed, and etched to form the gate electrode by a patterned mask. Apart from the gate electrode, the first metal layer is etched during the manufacturing process. The first metal layer can be Chromium, Molybdenum, Aluminum, or Copper. Preferably, a second common electrode is formed by patterning the first metal layer.

S203, forming a gate insulation layer on the gate electrode and on the base substrate which is not covered by the gate electrode;

S204, forming a color resist layer on the gate insulation layer;

The color resist layer is used to form the color resist. Preferably, S204 further comprises:

S2041, forming a color resist layer on the whole gate insulation layer;

S2042, etching the color resist layer at a position corresponding to the gate electrode to expose the gate insulation layer at a position corresponding to the gate electrode.

S205, forming an active layer on the color resist layer;

The active layer is used to form grooves between a drain electrode and a source electrode. The active layer can be amorphous silicon. The active layer is formed on the exposed gate insulation layer.

S206, forming a second metal layer on the active layer and on the color resist layer which is not covered by the active layer, and patterning the second metal layer to form the drain electrode and the source electrode;

Particularly, in S206, the second metal layer is exposed, developed, and etched to form the drain electrode and the source electrode by a patterned mask. Apart from the drain electrode and the source electrode, the second metal layer is etched during the manufacturing process. Patterning the second metal layer to form a first common electrode on the second metal layer by using the mask. In prior art, the common electrode is disposed on the second metal layer. However, in the present invention, the first common electrode is disposed on the second metal layer, which will make a distance between the pixel electrode and the second metal layer decrease and a storage capacitance increase since one color resist layer between the pixel electrode and the second metal layer is removed.

Preferably, the first common electrode and the second common electrode are connected with an identical common line, which prevents the difficult problem of disposing wires on the second metal layer.

Preferably, the mask has a first pattern and the transparent conductive layer has a plurality of domains. Transparent electrodes of different domains have different extending directions, which make tilting angles of liquid crystals of different domains have different angles, thereby lowering crosstalk phenomenon. A shape of the first pattern is consistent with a setting area, the setting area is an area formed of obscurus strips on a boundary between the domains on the transparent conductive layer; for example, a cross shape of obscurus strips on a boundary between the domains. A projection of the setting area on the second metal layer corresponding to an area of the first common electrode, which means that the setting of the first common line won't affect the aperture ratio.

Forming scan lines on the first metal layer and data lines on the second metal layer. In the technical proposal of the present invention, the color resist layer is formed before making the second metal layer, which decreases a capacitance between the first metal layer and the second metal layer in order to prevent the capacitive coupling effects occur in the intersection areas of the data lines and the scan lines.

In the prior art, the second passivation layer is used to insulate the color resist layer; however, in the present invention, the second metal layer is used to insulate the color resist layer and the transparent conductive layer, thereby saving one passivation layer in the manufacturing process.

S207, forming a passivation layer on the second metal layer;

S208, forming a via hole in the passivation layer for connecting to the second metal layer; and S209, forming a transparent conductive layer on the passivation layer.

The sputtering method can be used to form the transparent conductive layer on the passivation layer. The via hole is disposed in the passivation layer. Preferably, storage capacitance is formed between the pixel electrode and the first common electrode.

In the COA substrate manufacturing method of the present invention, by making the color resist layer before making the second metal layer, manufacturing cost is reduced by saving a passivation layer.

Figure 3:
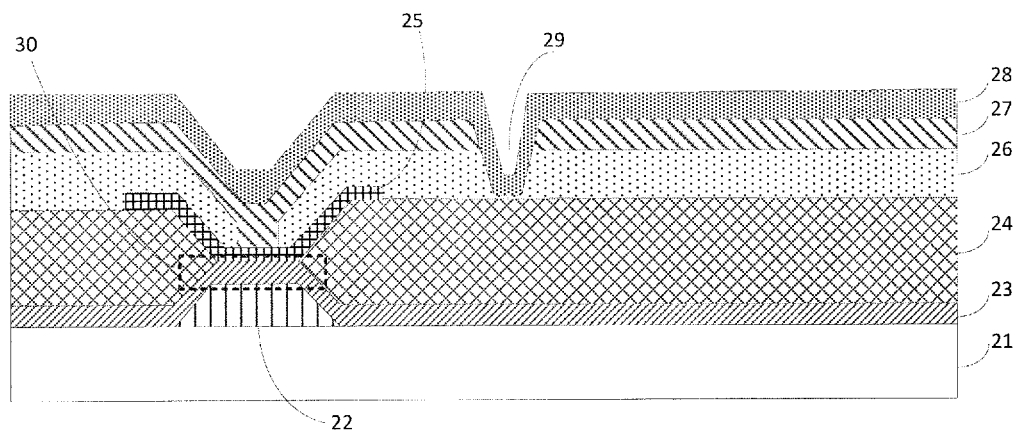
FIG. 3 is a schematic structural diagram of a COA substrate of the present invention.

Refer to FIG. 3, which is a schematic structural diagram of a COA substrate of the present invention.

In the present invention, the COA substrate comprises a base substrate 21, a first metal layer 22, a gate insulation layer 23, a color resist layer 24, an active layer 25, a second metal layer 26, a passivation layer 27, and a transparent conductive layer 28.

The first metal layer 22 is disposed on the base substrate 21. The first metal layer 22 comprises a gate area of a thin film field effect transistor. Apart from the gate electrode, the first metal layer 22 is etched during the manufacturing process, as shown in FIG. 3.

A part of the gate insulation layer 23 is disposed on the first metal layer 22 which is used to insulate the first metal layer 22 and the color resist layer 24. The color resist layer 24 is disposed on the gate insulation layer 23; the color resist layer 24 is used to form the color resist.

A part of the active layer 25 is disposed on the color resist layer 24, which is used to form grooves.

The second metal layer 26 is disposed on the active layer 25. The second metal layer 26 comprises a drain area and a source area of the thin film field effect field effect transistor.

The passivation layer 27 is disposed on the second metal layer 26. The via hole 29 is formed in the passivation layer 27 for connecting to the second metal layer 26.

The transparent conductive layer 28 is disposed on the passivation layer 27.

Preferably, the gate insulation layer 23 comprises a first area 30. The first area 30 of the gate insulation layer 23 corresponds to an area of the gate electrode, the color resist layer 24 is disposed on an area excluding the first area 30 in the gate insulation layer 23, and the active layer 25 disposed on the first area 30.

Preferably, the second metal layer 26 comprises a first common electrode.

Preferably, the second metal layer 26 is patterned by a mask to form the first common electrode on the second metal layer 26.

Preferably, the mask has a first pattern. The transparent conductive layer has a plurality of domains. Transparent electrodes of different domains have different extending directions, which makes tilting angles of liquid crystals of different domains have different angles, thereby lowering crosstalk phenomenon. A shape of the first pattern is consistent with a setting area, and the setting area is an area formed of obscurus strips on a boundary between the domains on the transparent conductive layer. A projection of the setting area on the second metal layer corresponds to an area of the first common electrode.

Preferably, the first metal layer further comprises second common electrode.

Preferably, the first common electrode and the second common electrode are connected with an identical common line.

Preferably, a storage capacitance is formed between the pixel electrode and the first common electrode.

Compared with FIG. 1, it is easy to understand that the COA substrate of the prior uses two passivation layers, however, the present invention only uses one passivation layer by making the color resist layer before the second metal layer, thereby decreasing manufacturing costs. The COA substrate manufacturing method of the present invention is disclosed above.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A Color filter On Array (COA) substrate manufacturing method, comprising:
    providing a base substrate;
    forming a first metal layer on the base substrate, and patterning the first metal layer to form a gate electrode;
    forming a gate insulation layer on the gate electrode and on the base substrate which is not covered by the gate electrode;
    forming a color resist layer on the whole gate insulation layer and etching the color resist layer only at a position corresponding to the gate electrode to expose the gate insulation layer at a position corresponding to the gate electrode;
    forming an active layer directly over the color resist layer;
    forming a second metal layer directly on the active layer and directly on the color resist layer which is not covered by the active layer, and patterning the second metal layer by a mask to form a drain electrode, a source electrode, and a first common electrode;
    forming a passivation layer on the second metal layer;
    forming a via hole in the passivation layer for connecting to the second metal layer; and
    forming a transparent conductive layer on the passivation layer.

2. The COA substrate manufacturing method according to claim 1, wherein the step of forming an active layer on the color resist layer further comprises:
    forming the active layer on the exposed gate insulation layer.

3. The COA substrate manufacturing method according to claim 1, wherein the transparent conductive layer comprises a pixel electrode, and storage capacitance is formed between the pixel electrode and the first common electrode.

4. A Color filter On Array (COA) substrate manufacturing method, comprising:
    providing a base substrate;
    forming a first metal layer on the base substrate, and patterning the first metal layer to form a gate electrode;
    forming a gate insulation layer on the gate electrode and on the base substrate which is not covered by the gate electrode;
    forming a color resist layer on the whole gate insulation layer and etching the color resist layer only at a position corresponding to the gate electrode to expose the gate insulation layer at a position corresponding to the gate electrode;
    forming an active layer directly over the color resist layer;
    forming a second metal layer directly on the active layer and directly on the color resist layer which is not covered by the active layer, and patterning the second metal layer to form a drain electrode and a source electrode;
    forming a passivation layer on the second metal layer;
    forming a via hole in the passivation layer for connecting to the second metal layer; and
    forming a transparent conductive layer on the passivation layer.

5. The COA substrate manufacturing method according to claim 4, wherein the step of forming a color resist layer on the gate insulation layer further comprises:
    forming a color resist layer on the whole gate insulation layer;
    etching the color resist layer at a position corresponding to the gate electrode to expose the gate insulation layer at a position corresponding to the gate electrode.

6. The COA substrate manufacturing method according to claim 5, wherein the step of forming an active layer on the color resist layer further comprises:
    forming the active layer on the exposed gate insulation layer.

7. The COA substrate manufacturing method according to claim 4, wherein:
    patterning the second metal layer by a mask to form a first common electrode on the second metal layer.

8. The COA substrate manufacturing method according to claim 7, wherein the method further comprises:
    patterning the first metal layer to form a second common electrode.

9. The COA substrate manufacturing method according to claim 7, wherein the first common electrode and the second common electrode are connected to an identical common line.

10. The COA substrate manufacturing method according to claim 4, wherein the transparent conductive layer comprises a pixel electrode, and storage capacitance is formed between the pixel electrode and the first common electrode.

* * * * *